(12) United States Patent
Von Keyserlingk et al.

(10) Patent No.: US 6,989,707 B2
(45) Date of Patent: Jan. 24, 2006

(54) SEMICONDUCTOR CIRCUIT AND INITIALIZATION METHOD

(75) Inventors: Graf Albert Von Keyserlingk, München (DE); Helmut Schneider, München (DE); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/419,596

(22) Filed: Apr. 21, 2003

(65) Prior Publication Data

US 2003/0197545 A1 Oct. 23, 2003

(30) Foreign Application Priority Data

Apr. 20, 2002 (DE) .............................. 102 17 710

(51) Int. Cl.
*G05F 11/16* (2006.01)
(52) U.S. Cl. ...................................... 327/526; 327/143
(58) Field of Classification Search ................ 327/525, 327/526, 143; 365/225.7
See application file for complete search history.

(56) References Cited

U.S. PATENT DOCUMENTS

| 5,467,039 A | 11/1995 | Bae ............................ 327/198 |
| 6,417,704 B1 * | 7/2002 | Nakajima et al. ........... 327/143 |
| 6,577,551 B2 * | 6/2003 | Ito et al. ................... 365/225.7 |

FOREIGN PATENT DOCUMENTS

DE 44 23 546 A1 1/1995

* cited by examiner

*Primary Examiner*—Quan Tra
(74) *Attorney, Agent, or Firm*—Laurence A. Greenberg; Werner H. Stemer; Ralph E. Locher

(57) ABSTRACT

A semiconductor circuit has at least one generator fuse for setting a supply voltage and at least one redundancy fuse for activating a redundancy element. A first read-out device is provided for reading out the generator fuse and a second read-out device reads out the redundancy fuse. The first read-out device is configured to read out the generator fuse at a first instant, and the second read-out device is configured to read out the redundancy fuse at a second instant.

10 Claims, 4 Drawing Sheets

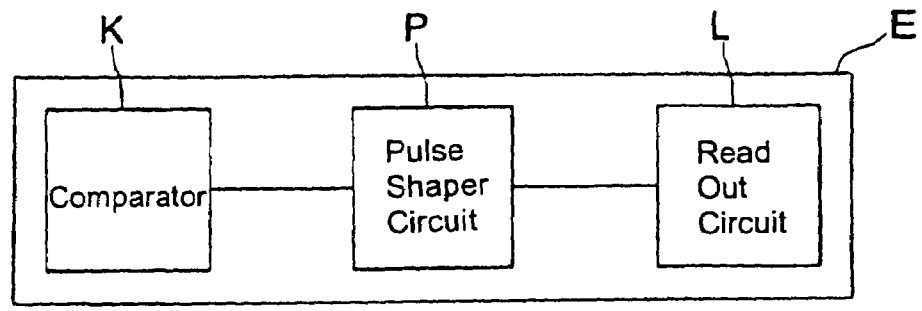
FIG. 1
PRIOR ART
FIG. 2
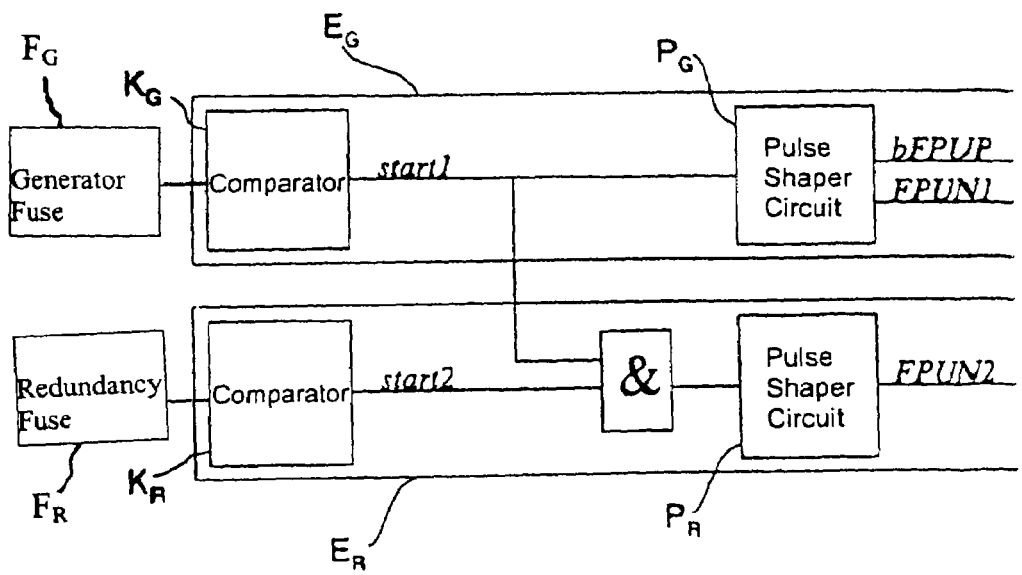

SEMICONDUCTOR CIRCUIT AND INITIALIZATION METHOD

BACKGROUND OF THE INVENTION

Field of the Invention

The invention relates to a semiconductor circuit having a multiplicity of fuses for setting internal operating parameters and hardware properties of the semiconductor circuit, and to a method for the optimized read-out of fuses.

Due to varying production conditions, integrated semiconductor circuits often have defectively produced structures that can restrict the functionality of the entire semiconductor chip. Thus, e.g. internal voltages do not reach the designated value on account of altered electrical properties of the structures, or lines such as e.g. word and bit lines may be defective.

In order to ensure the functionality of a semiconductor chip despite faults that occur, a multiplicity of fuses (fusible links) are used. These are components whose state (usually one of their electrical properties) can be permanently altered. Lines that are severed (blown) with the aid of a focused laser beam or a high electric current are predominantly used as fuses. Depending on the state of a fuse, e.g. a circuit can provide a specific voltage or replace a defective circuit.

In this case, the state of the corresponding fuse can be determined with the aid of a special read-out circuit (fuse latch circuit). In this case, a specific voltage value is usually produced at an output of the fuse latch circuit depending on the conductivity of the fuse. Thus, e.g. an unblown fuse supplies the value L (low), while a blown fuse produces the value H (high).

Since the fuses can be used to set important parameters for optimum operation, such as e.g. the internal supply voltage, the fuses are usually read out during the initialization phase of the semiconductor chip, i.e. while all the voltages build up internally in the semiconductor chip.

In this case, conventional semiconductor circuits provide for all the fuses of the semiconductor circuit to be read out, during the initialization phase, at an early instant, at which the supply voltage is still unstable. The unstable supply voltage often gives rise to the defective read-out of inadvertently blown fuses. In order to reduce these faults, the switching threshold of the fuse latch circuit is usually increased by corresponding dimensioning of the circuit at the expense of susceptibility to $\alpha$ radiation.

SUMMARY OF THE INVENTION

It is accordingly an object of the invention to provide a semiconductor circuit and an initialization method that overcomes the above-mentioned disadvantages of the prior art devices of this general type, which is optimized for reading-out. Furthermore, it is an object of the invention to provide a semiconductor circuit for the optimized read-out of fuses With the foregoing and other objects in view there is provided, in accordance with the invention, a combination of a semiconductor circuit having at least one generator fuse for setting a supply voltage and at least one redundancy fuse for activating a redundancy element, with a read-out circuit. The read-out circuit contains a read-out device coupled to and reading out the redundancy fuse. The read-out device reads out the redundancy fuse in a manner time-shifted with respect to the generator fuse.

According to the invention, the redundancy fuses provided for activating redundancy elements are read out at a later instant than the generator fuses provided for setting internal voltages. Since the supply voltage of the semiconductor module rises continuously during the initialization phase, it has a higher value at the later read-out instant than at the first instant, at which the generator fuses are read out. As a result of this, an improved detection behavior of the corresponding fuse latch circuits is achieved and the risk of redundancy fuses being read out defectively is thus reduced.

One advantageous embodiment of the invention provides for the read-out instant of the redundancy fuse to be implemented by control of the gate voltage of a read-out transistor connected in series with the redundancy fuse. This makes it possible to achieve an optimized read-out of the redundancy fuse even without significant changes in the corresponding fuse latch circuit.

A further advantageous embodiment of the invention provides for the read-out device for the redundancy fuse to have a comparator which starts the read-out operation of the redundancy fuse only once a supply voltage is almost completely built up. This makes it possible to ensure that the redundancy fuse is read out under voltage conditions that are as high and as stable as possible.

Moreover, it is advantageous to configure the comparator of the redundancy fuse read-out circuit with a higher switching threshold than a conventional comparator, since a reliable read-out of the redundancy fuse is achieved in a particularly simple manner as a result of this.

Furthermore, it is advantageous to configure the generator read-out device with an optimized dimensioning with respect to the redundancy read-out device. What is thereby achieved is that the generator read-out device allows a reliable read-out of the generator fuse despite unstable operating conditions during the initialization phase of the semiconductor circuit.

In accordance with an added feature of the invention, the read-out device includes a fuse latch circuit having a read-out transistor connected in series with the redundancy fuse for reading out a state of the redundancy fuse. The read-out device determines a read-out instant of the redundancy fuse by controlling a gate voltage of the read-out transistor.

In accordance with a further feature of the invention, a comparator is provided for determining a read-out instant of the redundancy fuse during an initialization phase of the semiconductor circuit in a manner dependent on the supply voltage. The comparator starts a read-out operation of the redundancy fuse at an instant at which the supply voltage is completely or almost completely built up.

In accordance with another feature of the invention, a further read-out device is coupled to and reads out the generator fuse. The further read-out device has a further comparator for determining a read-out instant of the generator fuse in a manner dependent on the supply voltage. The comparator has a higher switching threshold than the further comparator.

With the foregoing and other objects in view there is provided, in accordance with the invention, a method for reading out fuses of a semiconductor circuit having at least one generator fuse for setting a supply voltage and at least one redundancy fuse for activating a redundancy element of the semiconductor circuit, and, in an initialization phase of the semiconductor circuit, the supply voltage of the semiconductor circuit builds up from a lower voltage value up to an upper voltage value. The method includes reading-out the generator fuse at a first instant of the initialization phase, at which the supply voltage has reached a first voltage value, and reading-out of the redundancy fuse at a second instant of the initialization phase at which the supply voltage has reached a second voltage value.

In accordance with an additional mode of the invention, there is the step of setting a rate of change of the supply voltage to be greater at the first instant than at the second instant.

In accordance with an added mode of the invention, there is the step of building up the supply voltage completely or almost completely at the second instant.

In accordance with another mode of the invention, there is the step of using a read-out transistor of a fuse latch circuit for aiding in reading-out the redundancy fuse. A switching threshold of the fuse latch circuit is increased prior to the reading-out of the redundancy fuse.

In accordance with a concomitant mode of the invention, there is the step of increasing the switching threshold of the fuse latch circuit by changing a gate voltage of the read-out transistor connected in series with the redundancy fuse.

Other features which are considered as characteristic for the invention are set forth in the appended claims.

Although the invention is illustrated and described herein as embodied in a semiconductor circuit and an initialization method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit block diagram of a read-out device for reading out a fuse with a comparator, a pulse shaper circuit and a read-out circuit according to the prior art;

FIG. 2 is a circuit block diagram of two read-out devices for reading out a generator fuse and a redundancy fuse according to the invention;

DESCRIPTION OF THE PREFERRED EMBODIMENTS

Figure 3A:
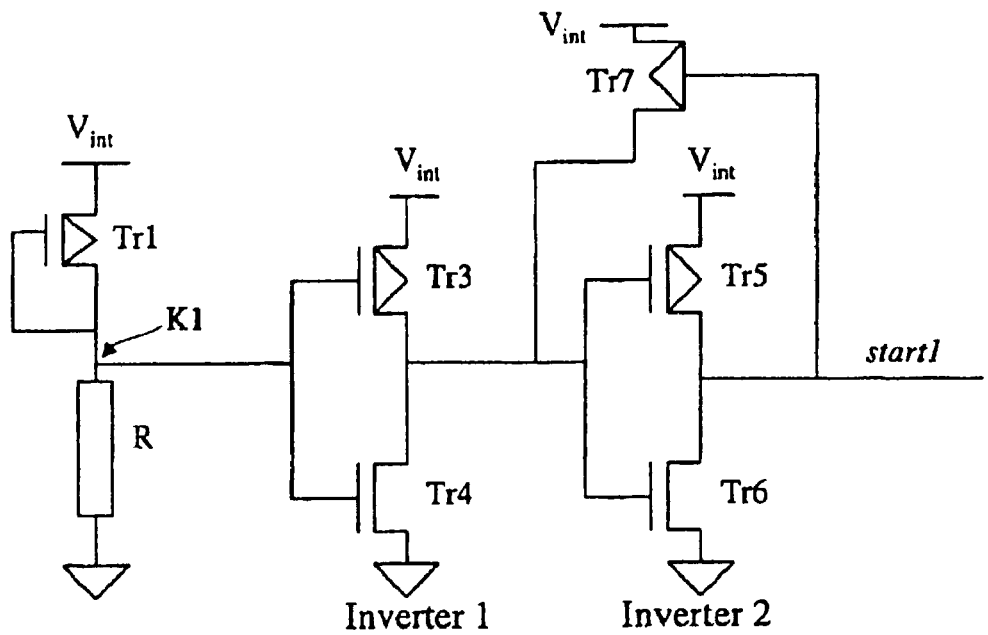
FIG. 3A is a circuit diagram of a comparator for reading out a generator fuse according to the prior art.

In all the figures of the drawing, sub-features and integral parts that correspond to one another bear the same reference symbol in each case. Referring now to the figures of the drawing in detail and first, particularly, to FIG. 1 thereof, there is shown diagrammatically the construction of a conventional read-out device E for reading out a fuse F of an electronic semiconductor circuit. In this case, the read-out device E contains a comparator K for determining the read-out instant, a pulse shaper circuit P for generating control signals, and also a read-out circuit L for reading out the corresponding fuse F. In this case, an output of the comparator K is connected to an input of the pulse shaper circuit P via a signal line, while an output of the pulse shaper P is connected to an input of the read-out circuit L via a control line.

FIG. 2 diagrammatically shows a configuration of two read-out devices $E_R$, $E_G$ for reading out a generator fuse and a redundancy fuse $F_G$, $F_R$ of a semiconductor circuit. In each case only the comparator $K_G$, $K_R$ and the pulse shaper circuit $P_G$, $P_R$ of the respective read-out devices $E_G$, $E_R$ are illustrated here.

In this case, the first comparator $K_G$ is preferably of conventional design and generates a first start signal start1 at a specific instant during an initialization phase of the semiconductor circuit. The start1 signal causes the first pulse shaper circuit $P_G$ to generate two control signals bFPUP, FPUN1 at two of its outputs.

The second comparator $K_R$ is configured according to the invention and preferably generates a second start signal start2 at a later instant during the initialization phase of the semiconductor circuit, which signal is present at one of two inputs of a logic AND gate. The AND gate, disposed between the second comparator $K_R$ and the second pulse shaper circuit $P_R$, serves for defining a specific signal order. The start1 signal is present at the other input of the AND gate. Only when both start signals start1, start2 are present does the AND gate forward a start signal to the second pulse shaper circuit $P_R$, whereupon the latter generates a control signal FPUN2 at its output.

FIG. 3A shows the first comparator $K_G$ of the read-out device $E_G$ of the generator fuse $F_G$, which preferably has a conventional construction.

In this case, the first comparator $K_G$ may preferably be divided into a voltage divider and two inverters. In this case, the voltage divider contains a nonreactive resistor R, which is connected in series between the supply voltage $V_{int}$ and ground, and a p-channel field-effect transistor Tr1, whose gate electrode is connected to the drain electrode.

Accordingly, the voltage divider generates at the node K1 a voltage $V_{K1}$, which corresponds to the supply voltage $V_{int}$ reduced by the threshold voltage $V_{Tr1}$ of the transistor $T_{r1}$:

$$V_{K1} = V_{int} - V_{Tr1}.$$

The node voltage $V_{K1}$ is present at the input of the first inverter. The first inverter is of a traditional configuration and has a p-channel and an n-channel field-effect transistor Tr3, Tr4, which are configured in series between the supply voltage $V_{int}$ and ground. The first inverter supplies an inverted level with respect to the logic level of the node voltage $V_{K1}$, in which case, given a low node voltage $V_{K1}$, the n-channel field-effect transistor Tr4 of the first inverter turns off, while the p-channel field-effect transistor Tr3 pulls the output of the first inverter to a high level. The high level of the first inverter causes the p-channel field-effect transistor Tr5 of the second inverter to turn off, while its n-channel field-effect transistor Tr6 opens and thus pulls the output of the second inverter to ground. This state is locked by a further p-channel field-effect transistor Tr7, which is disposed between the supply voltage $V_{int}$ and the input of the second inverter and whose gate is connected to the output of the second inverter.

It is only starting from a specific level of the supply voltage $V_{int}$ that the node voltage $V_{K1}$ reaches a value at which the first inverter circuit toggles. In this case, the p-channel field-effect transistor Tr3 of the first inverter circuit turns off, while the n-channel field-effect transistor Tr4 pulls the output of the first inverter circuit to ground. The low level at the input of the second inverter circuit causes the n-channel field-effect transistor Tr6 of the second inverter to turn off, while its p-channel field-effect transistor Tr5 puts the output of the second inverter at the level of the supply voltage $V_{int}$ and thus generates the start1 signal. The instant for reading out the fuse F is thus determined in a manner dependent on the supply voltage $V_{int}$.

Figure 3B:
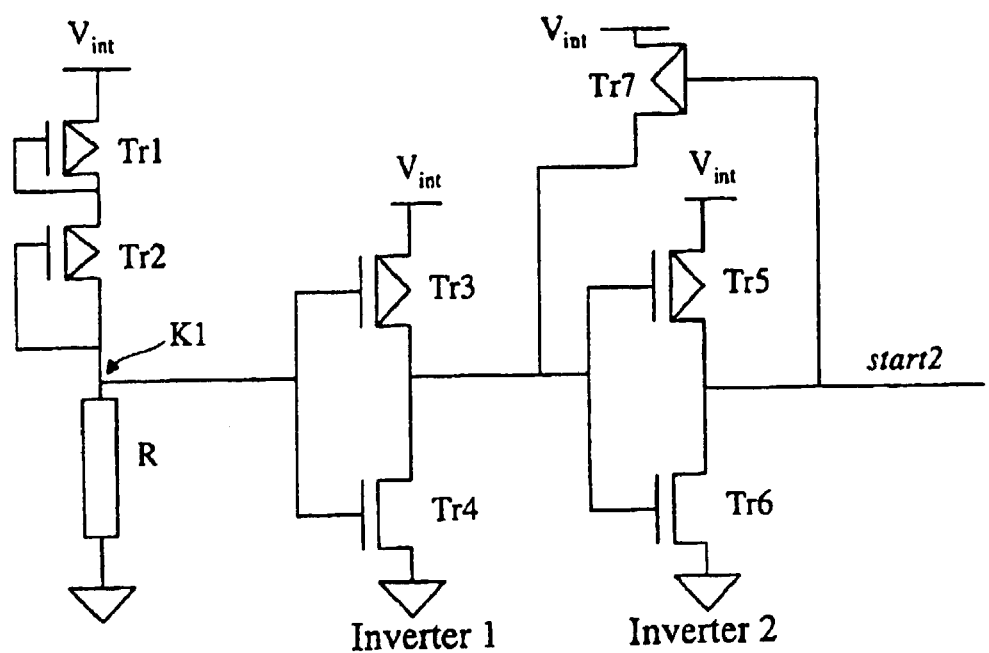
FIG. 3B is a circuit diagram of a comparator for reading out a redundancy fuse according to the invention.

FIG. 3B shows the internal construction of the second comparator $K_R$ from FIG. 2, which can in turn be subdivided into a voltage divider and two inverter circuits. In this case, the voltage divider exhibits a series circuit containing a nonreactive resistor R and two p-channel field-effect transistors Tr1, Tr2, whose gate electrodes are coupled to the respective drain electrodes. In this case, the two inverter circuits of the second comparator $K_R$ are configured analogously to FIG. 3A. On account of the series circuit of the two p-channel transistors Tr1, Tr2 of the voltage divider, the node voltage $V_{K1}$ of the second comparator $K_R$ is reduced with respect to the node voltage of the first comparator $K_G$ by the threshold voltage of the second transistor Tr2:

$$V_{K1}=(V_{int}-V_{Tr1})-V_{Tr2}.$$

What is thereby achieved is that the switching threshold of the first inverter is temporally delayed when the supply voltage $V_{int}$ is run up during an initialization phase of the semiconductor module. The delay is critically determined by the magnitude of the threshold voltage $V_{Tr2}$ of the additional p-channel field-effect transistor Tr2 in the voltage divider of the second comparator $K_R$ and by the temporal profile of the supply voltage $V_{int}$. It corresponds to the temporal delay of the second start signal with respect to the first start signal of the first comparator $K_G$ from FIG. 3A.

Figure 4:
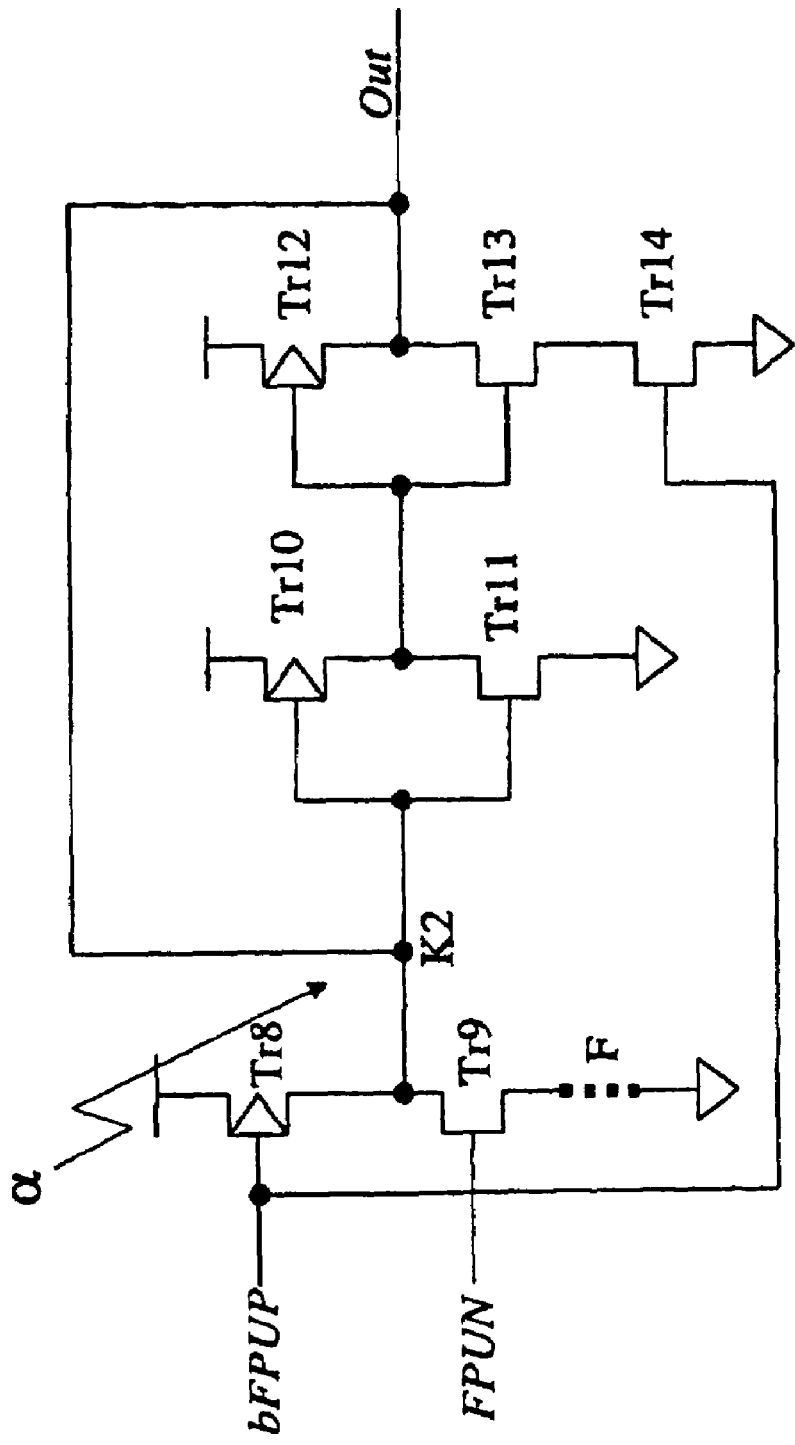
FIG. 4 is a circuit diagram of a read-out circuit for reading out a fuse according to the invention.

FIG. 4 shows, by way of example, the internal construction of a read-out circuit for a fuse F, which is also called fuse latch circuit hereinafter. In this case, the fuse F is preferably configured as a fusible link which can be closed with the aid of a laser or a high electric current in order to define properties of the semiconductor module. For the read-out of the fuse F, the fuse latch circuit L has a voltage divider whose voltage value is locked by two inverter circuits connected downstream of it. In this case, the electrical potential of node K2 and hence the output signal of the fuse latch circuit L are determined in a manner dependent on the state of the fuse F. To that end, the node $K_1$ is decoupled from the supply voltage $V_{int}$ by the application of a high level signal bFPUP to the p-channel field-effect transistor Tr8 of the voltage divider. The FPUN signal has a low level potential at this instant, as a result of which the n-channel field-effect transistor Tr9 of the voltage divider, also called a read-out transistor Tr9 hereinafter, is turned off. The read-out transistor Tr9 is turned on by the activation of the FPUN signal, so that the electrical potential of the node $K_2$ is pulled to ground in the case of an intact fuse F. By contrast, if the fuse F is already blown, then the node $K_2$ remains at its high level potential. The series circuit of the two inverters locks the respective voltage potential of the node $K_2$ and outputs a high level signal in the case of a closed fuse F, and a low level signal in the case of an unclosed fuse F, to the output of the read-out or fuse latch circuit L. In this case, the coupling of the bFPUP signal line to a second n-channel field-effect transistor Tr14 of the second inverter ensures that the output of the fuse latch circuit L cannot be pulled to ground before the read-out of the fuse F.

The high integration densities of present-day semiconductor modules makes it more and more difficult for fuses to be blown precisely, e.g. with the aid of a laser. Therefore, there is an increase in the risk that, when blowing specific fuses F, adjacent fuses will also be slightly affected, with the result that their resistance likewise changes. In this case, the resistance of the adjacent fuses may rise in such a way that an unblown fuse is detected as a blown fuse. In order to avoid such sources of error, the entire fuse latch circuit L is conventionally redimensioned, as a result of which its switching threshold is adapted to higher resistances. However, increasing the switching threshold of the fuse latch circuit L also entails an increased sensitivity to α radiation. α radiation can alter the electrical potential of the node $K_2$ at the read-out instant in such a way that the fuse latch circuit L toggles to the respective other value and, consequently, the fuse F is read out incorrectly. Since fuses F read out incorrectly mean that important operating parameters of the semiconductor circuit, such as e.g. internal voltages, are set incorrectly or defective structures, such as e.g. word lines, are not replaced by redundant elements, the functionality of the entire semiconductor module is jeopardized in such a case.

The dimensioning of a conventional fuse latch circuit therefore represents a compromise between the sensitivity toward α radiation and the sensitivity to imprecisely affected fuses. However, the instability of the supply voltage $V_{int}$ during the initialization phase of the semiconductor module hides additional uncertainties during the read-out operation of the fuses F.

However, the high uncertainty during the read-out of the fuses F can drastically impair the yield, i.e. the number of functioning chips per number of fabricated chips of conventional semiconductor modules.

In order to increase the certainty during the read-out of the fuses F and thus to reduce the losses of yield, the invention envisages changing the switching threshold of the fuse latch circuit L by a control of the gate voltage of the read-out transistor Tr9. An increase in the gate voltage takes the switching threshold upward, while a decrease in the voltage results in a lowering of the switching threshold.

Such a control can advantageously be affected by the temporal control of the read-out instant of a fuse F. As illustrated in the description concerning FIGS. 3A and 3B, the corresponding start signal can be delayed by increasing the switching threshold of the respective comparator. Since the supply voltage $V_{int}$ is significantly higher at the later read-out instant $t_2$, the high level potential of the control signal FPUN of the read-out transistor Tr9 has a higher level than at the instant $t_1$. This reduces the nonreactive resistance of the channel path of the read-out transistor Tr9. On account of the lower nonreactive resistance of the series circuit containing the fuse F and the read-out transistor Tr9, the switching threshold of the fuse latch circuit L rises, as a result of which the sensitivity to a partly blown fuse F is also reduced without increasing the sensitivity to α radiation.

Figure 5:
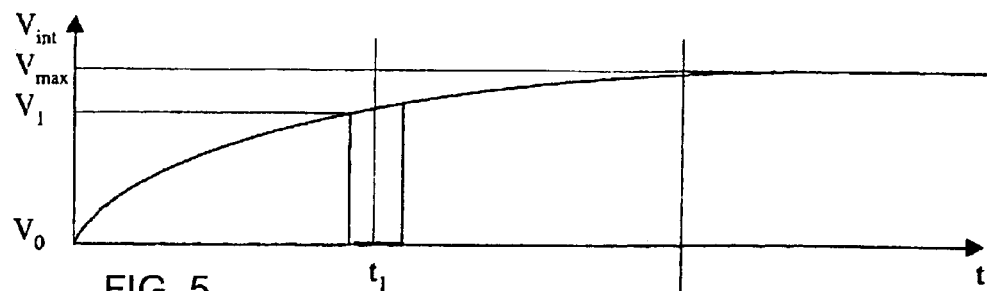
FIG. 5 is a timing diagram of the read-out operations of a conventional read-out device according to the prior art.

FIG. 5 shows a timing diagram for illustrating a conventional fuse read-out operation during an initialization phase of a semiconductor module. In this case, the profile of the supply voltage $V_{int}$ is plotted against time, the voltage rising from a lower voltage value $V_0$ to a maximum voltage value $V_{max}$. In this case, the generator and the redundancy fuses $F_G$, $F_R$ of the semiconductor module are read out at an instant $t_1$ at which the supply voltage $V_{int}$ has not yet reached its maximum value $V_{max}$. On account of the high instability of the supply voltage $V_{int}$ at the instant $t_1$, the read-out of the fuses $F_G$, $F_R$ is subject to a high error rate. The defective read-out of the fuses $F_G$, $F_R$ may be accompanied by functional disturbances of the entire semiconductor circuit and hence losses of yield as well.

Figure 6A:
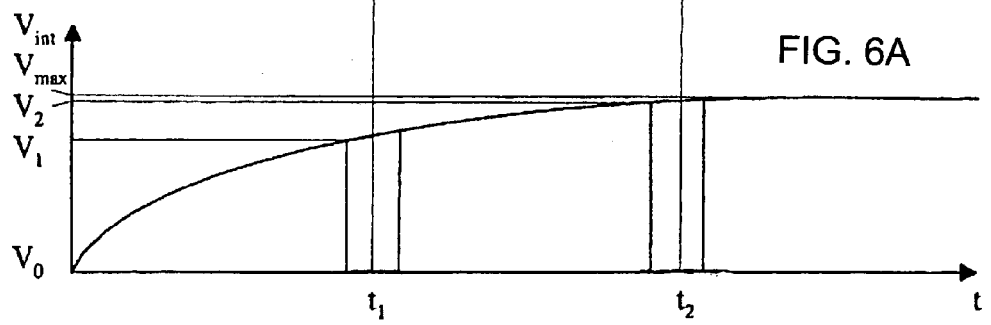
FIGS. 6A and 6B are timing diagrams for representing the read-out operations of the read-out device according to the invention.
Figure 6B:
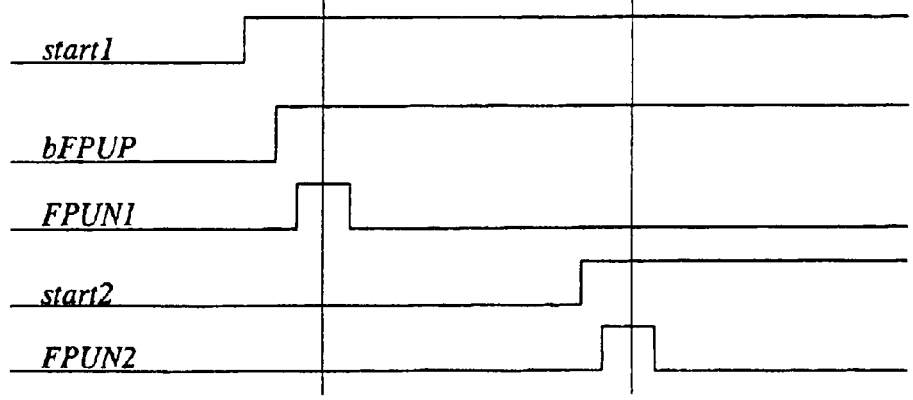

FIGS. 6A and 6B illustrate the read-out scheme of the method according to the invention, FIG. 6A, analogously to FIG. 5, illustrating the profile of the supply voltage $V_{int}$ as a function of time, while FIG. 6B illustrates the temporal profile of the corresponding signals.

As can be seen from FIG. 6A, the generator fuses are preferably read out at the same instant as the totality of the fuses F in the conventional method illustrated in FIG. 5. In order to avoid the uncertainty—brought about by the instability of the supply voltage $V_{int}$—during the read-out of the fuses F and the associated negative effects for the entire semiconductor module, the fuses F are divided into two groups, the first group preferably containing those fuses F whose read-out uncertainty merely has a slight influence on the functionality of the entire semiconductor circuit. These preferably include the generator fuses $F_G$, since a change in the internal supply voltage brought about by defective read-out is often also still within the tolerance limits of the semiconductor module and the operation of the semiconductor module is thereby usually limited to an insignificant extent. Therefore, the first group of fuses $F_G$ is preferably read out analogously to the conventional read-out scheme of FIG. 5, at a first instant t1, in order to be able to set the required internal voltages during the initialization phase. In order to reduce the uncertainty during the read-out of the generator fuses $F_G$, these few fuses $F_G$ can be configured in area-noncritical regions of the semiconductor module in such a way that they are insensitive to α radiation and can therefore be reliably blown.

The second group of fuses F preferably contains all the redundancy fuses $F_R$ of the semiconductor circuit and, according to the invention, is only read out at a later instant $t_2$ at which the supply voltage $V_{int}$ is already relatively stable. As shown in FIG. 6A, at this instant, the supply voltage $V_{int}$ has already almost completely reached its maximum value $V_{max}$ and is subject only to a slight change. On account of the higher supply voltage $V_{int}$, as already mentioned in the description concerning FIG. 4, the switching threshold of the corresponding fuse latch circuit $L_R$ is raised and, as a result, the error rate during the read-out of inadvertently affected redundancy fuses $F_R$ is significantly reduced. Equally, the sensitivity of the fuse latch circuit $L_R$ to α radiation is reduced on account of the higher and stabler supply voltage $V_{int}$ at the second read-out instant $t_2$. As a result, the states of the redundancy fuses $F_R$ are determined with a higher certainty by comparison with a conventional read-out method.

FIG. 6B shows the temporal profile of the signals of the configuration from FIG. 2. In this case, the first comparator $K_G$ generates the start1 signal in the case of a first threshold value of the supply voltage $V_{int}$. Afterward, the first pulse shaper circuit $P_G$ generates first a bFPUP signal and shortly after that an FPUN1 signal in order to read out the corresponding generator fuse $F_G$ of the semiconductor module using the fuse latch circuit $L_G$. Only after the supply voltage $V_{int}$ has reached a second threshold value does the comparator $K_R$ of the second read-out device $E_2$ generate the start2 signal, which causes the second pulse shaper circuit $P_R$ to generate the FPUN2 signal, as a result of which ultimately the corresponding redundancy fuse $F_R$ is read out by the second fuse latch circuit $L_R$.

The features of the invention which are disclosed in the above description, the drawings and the claims may be of importance both individually and in any desired combination for the realization of the invention in its various configurations.

We claim:

1. A semiconductor circuit, comprising:
at least one supply voltage generating fuse and at least one redundancy element activating fuse; and
a read-out circuit including:
a first read-out device coupled to and reading out the supply voltage generating fuse, said first read-out device starting the read out operation of the supply voltage generating fuse when a supply voltage has reached a first voltage value, said first read-out device including a first comparator and a first pulse shaper circuit, said first comparator generating a first start signal at a specific instant during an initialization phase of the semiconductor circuit, said first start signal being forwarded to said first pulse shaper circuit and to a first input of a logic AND gate;
a second read-out device coupled to and reading out the redundancy element activating fuse, said second read-out device starting the read out operation of the redundancy element activating fuse when a supply voltage has reached a second voltage value, said second voltage value being higher than said first voltage value, said second read-out device including a second comparator and a second pulse shaper circuit, said second comparator generating a second start signal at a later instant during the initialization phase of the semiconductor circuit, said second start signal being forwarded to a second input of said logic AND gate, said logic AND gate forwarding a third start signal to said second pulse shaper circuit when said first and second start signals are present; and
said second read-out device subsequently reading out the redundancy element activating fuse in a manner time-shifted with respect to the supply voltage generating fuse.

2. The semiconductor circuit according to claim 1, wherein said second read-out device includes a fuse latch circuit having a read-out transistor connected in series with the redundancy element activating fuse for reading out a state of the redundancy element activating fuse, said second read-out device determining a read-out instant of the redundancy element activating fuse by controlling a gate voltage of Said read-out transistor.

3. The semiconductor circuit according to claim 1, wherein said second comparator of said second read-out device determines a read-out instant of the redundancy element activating fuse during an initialization phase of the semiconductor circuit in a manner dependent on the supply voltage, said second comparator starting a read-out operation of the redundancy element activating fuse at an instant at which the supply voltage is one of completely and almost completely built up.

4. The semiconductor circuit according to claim 3, wherein said first comparator of said first read-out device determines a read-out instant of the supply voltage generating fuse in a manner dependent on the supply voltage, said second comparator having a higher switching threshold than said first comparator.

5. The semiconductor circuit according to claim 4, wherein said first read-out device has an optimized dimensioning with respect to said second read-out device, to ensure a reliable reading-out of the supply voltage generating fuse under unstable operating conditions during an initialization phase of the semiconductor circuit.

6. A method for reading out fuses of a semiconductor circuit in an initialization phase of the semiconductor circuit, a supply voltage of the semiconductor circuit building up from a lower voltage value to an upper voltage value during the initialization phase, the method which comprises the steps of:

separating the fuses into a group having at least one supply voltage generating fuse and a group having at least one redundancy element activating fuse of the semiconductor circuit;

reading-out the supply voltage generating fuse at a first instant of the initialization phase, at which the supply voltage has reached a first voltage value, generating a first start signal at a specific instant during the initialization phase of the semiconductor circuit, and forwarding the first start signal to a first pulse shaper circuit and to a first input of a logic AND gate; and subsequently reading-out the redundancy element activating fuse at a second instant of the initialization phase at which the supply voltage has reached a second voltage value, the second voltage value being higher than the first voltage value, generating a second start signal at a later instant during the initialization phase of the semiconductor circuit, forwarding the second start signal to a second input of the logic AND gate, and the logic AND gate forwarding a third start signal to a second pulse shaper circuit when the first and second start signals are present at the logic AND gate.

7. The method according to claim 6, which further comprises setting a rate of change of the supply voltage to be greater at the first instant than at the second instant.

8. The method according to claim 6, which further comprises building up the supply voltage one of completely and almost completely at the second instant.

9. The method according to claim 6, which further comprises using a read-out transistor of a fuse latch circuit for aiding in reading-out the redundancy element activating fuse, a switching threshold of the fuse latch circuit being increased prior to the reading-out of the redundancy element activating fuse.

10. The method according to claim 9, which further comprises increasing the switching threshold of the fuse latch circuit by changing a gate voltage of the read-out transistor connected in series with the redundancy element activating fuse.

* * * * *